Figure 1:
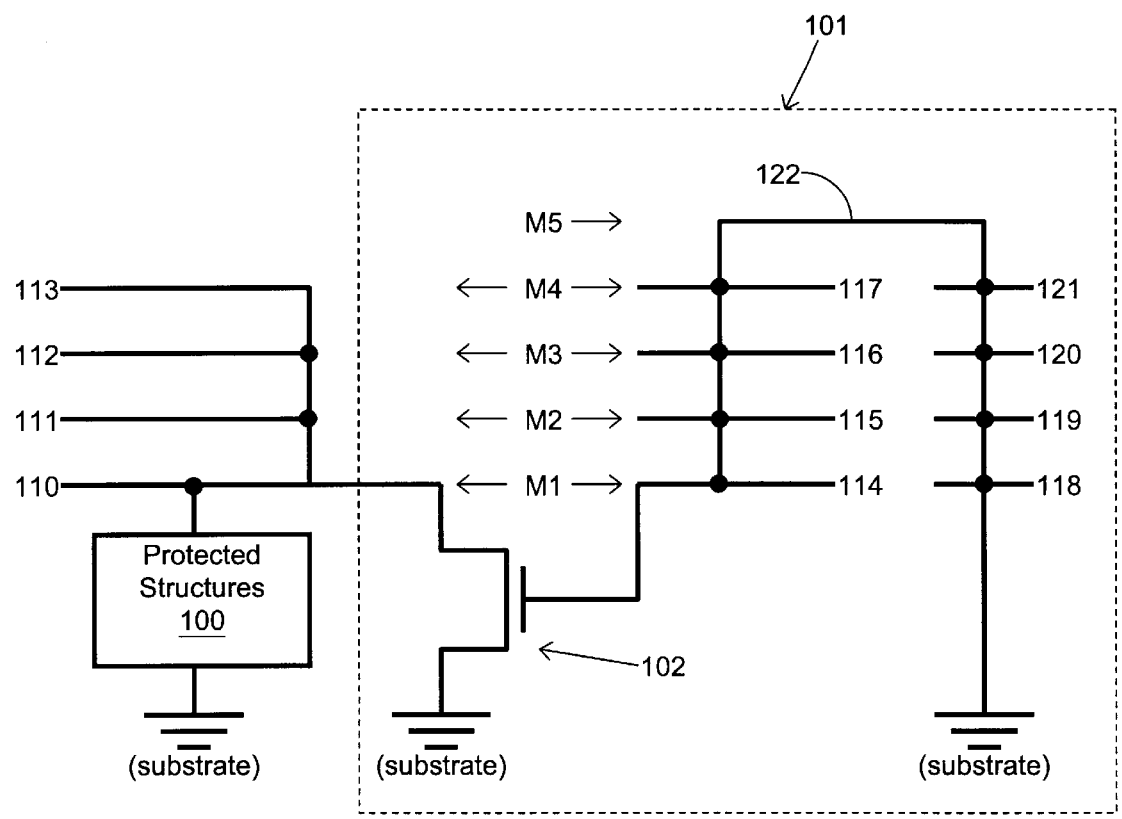

United States Patent [19]
Beatty

[11] Patent Number: 6,117,714
[45] Date of Patent: Sep. 12, 2000

[54] METHOD FOR PROTECTING A TRANSISTOR GATE FROM CHARGE DAMAGE

[75] Inventor: Timothy S. Beatty, Mesa, Ariz.

[73] Assignee: Intel Corporation, Santa Clara, Calif.

[21] Appl. No.: 09/363,244

[22] Filed: Jul. 28, 1999

Related U.S. Application Data

[62] Division of application No. 08/997,502, Dec. 23, 1997, Pat. No. 6,034,433.

[51] Int. Cl.⁷ ........................ H01L 21/28; H01L 21/3065
[52] U.S. Cl. .......................... 438/196; 438/618; 438/669; 438/720
[58] Field of Search ............................. 257/360; 438/237, 438/669, 618, 720, 196, FOR 355

[56] References Cited

U.S. PATENT DOCUMENTS

| | | |
|---|---|---|
| 4,941,028 | 7/1990 | Chen et al. . |
| 5,760,455 | 6/1998 | Diaz . |
| 5,793,069 | 8/1998 | Schuelein . |

*Primary Examiner*—George Fourson
*Assistant Examiner*—Barbara Elizabeth Abbott
*Attorney, Agent, or Firm*—David J. Kaplan

[57] ABSTRACT

A method and apparatus for preventing charge damage to a protected structure during processing of a semiconductor device. A first source/drain region of a protection transistor is coupled to a protected transistor gate. A second source/drain region of the protection transistor is coupled to ground. The protection transistor is then turned on during the processing of the device to ground the protected transistor gate.

10 Claims, 4 Drawing Sheets

METHOD FOR PROTECTING A TRANSISTOR GATE FROM CHARGE DAMAGE

This application is a division of application Ser. No. 08/997,502 filed Dec. 23, 1997, now U.S. Pat. No. 6,034, 433.

FIELD OF THE INVENTION

The present invention relates to semiconductor devices and more particularly to a process and circuit for protecting transistor gates from charge damage during processing.

BACKGROUND OF THE INVENTION

Current semiconductor devices, including processors, memory storage devices, controllers, and other integrated circuits, include transistors. A transistor is a three node device that controls the flow of electric current between two of its nodes, called the source/drain regions, based on the amount of charge applied to a third node, called the gate. Semiconductor devices are being manufactured in increasingly smaller sizes to increase their speed and decrease their power consumption and manufacturing cost. Unfortunately, as transistor size is reduced, the transistor gates become more susceptible to damage. A damaged transistor gate can result in either a poor quality semiconductor device or a nonfunctional device.

The gates of most transistors include three components, metal, oxide, and semiconductor material. For this reason, these transistors are called MOS transistors. The metal portion of the gate is also known as the gate electrode. The gate electrode may include metal or any other electrically conductive material such as highly doped polysilicon. As used herein, the term "gate" refers to the gate electrode. The gate oxide may include silicon dioxide or any other dielectric material such as silicon nitride. The semiconductor material may include silicon or any other semiconductor material such as gallium-arsenide.

One way that transistor gates can be damaged is by gate charging. Gate charge damage occurs when the gate of a transistor becomes charged (positively or negatively). Once this charge exceeds a certain threshold, the gate oxide breaks down, and the gate is discharged through the gate oxide and into the semiconductor substrate. This can damage the gate oxide, causing the transistor to perform poorly or to be entirely nonfunctional. Charging can also damage other structures in a semiconductor device, such as capacitors, diodes, resistors, and electrical interconnects.

A transistor gate is charged up during the manufacturing process. During processing of the semiconductor device, electrical interconnects, primarily comprising aluminum, are etched using an etch technique called reactive ion etching (RIE). In RIE, high voltages are applied to a gaseous mixture of etching chemicals in a vacuum chamber to form a plasma. The semiconductor device resides inside the chamber on a plate that is electrically biased with respect to a plate disposed on the opposite side of the plasma. The bias causes energetic ions from the plasma to accelerate toward the semiconductor device. Upon contacting the surface of the semiconductor device, the ions react with elements in the electrical interconnects, such as aluminum, to form a volatile compound that is pumped out of the chamber.

The high voltages and ionic reactions during RIE processing result in the electrical interconnects becoming charged up. Some of these electrical interconnects are coupled to transistor gates. Because of the conductive nature of electrical interconnects, charge on the electrical interconnects is transferred to the transistor gates. When the charge on the electrical interconnects becomes too large (either positively or negatively), the gate oxide breaks down, damaging the transistor.

One way to prevent this breakdown during processing is to couple a protection circuit to the electrical interconnects that are coupled to transistor gates and other structures in the semiconductor device that are susceptible to charge damage. A protection circuit is simply a diode, coupled to the interconnect, that is reverse biased when the interconnect is charged up. The diode is designed such that its reverse bias breakdown voltage is less than the voltage at which the protected transistor gate oxide breaks down.

Unfortunately, as transistors become smaller and gate oxide thickness decreases, the voltage at which the gate oxide breaks down may become smaller than the reverse bias breakdown voltage of the diode in the protection circuit. In this scenario, the protected structure is damaged before the protection circuit is activated.

SUMMARY OF THE INVENTION

A method and apparatus are described for preventing charge damage to a protected structure during processing of a semiconductor device. A first source/drain region of a protection transistor is coupled to a protected transistor gate. A second source/drain region of the protection transistor is coupled to ground. The protection transistor is then turned on during the processing of the device to ground the protected transistor gate.

Other features and advantages of the present invention will be apparent from the accompanying drawings and the detailed description that follows.

BRIEF DESCRIPTION OF THE DRAWINGS

The present invention is illustrated by way of example and not limitation in the figures of the accompanying drawings in which like references indicate similar elements and in which:

FIG. 1 is a protection circuit schematic in accordance with one embodiment of the present invention;

FIG. 2*a* is the protection circuit of FIG. 1 during processing of the semiconductor device;

FIG. 2*b* is the protection circuit of FIG. 1 during operation of the semiconductor device; and FIG. 3 is a protection circuit schematic in accordance with an alternate embodiment of the present invention.

DETAILED DESCRIPTION

A method and apparatus are described for preventing charge damage to a protected transistor gate during processing of a semiconductor device. For one embodiment of the present invention, the protected transistor gate is coupled to a first interconnect at a first interconnect layer of the semiconductor device. A second interconnect, in the same interconnect layer, is coupled to the gate of a protection transistor. A first source/drain region of the protection transistor is coupled to the first interconnect. A second source/drain region of the protection transistor is coupled to a substrate tap.

During RIE processing of the semiconductor device, both the first and second interconnects are charged up while being etched, and the semiconductor substrate is coupled to ground. The charge on the second interconnect is applied to the protection transistor gate, turning on the transistor. Once turned on, the protection transistor drains the charge from the first interconnect to ground through the first source/drain region, the second source/drain region, and the substrate tap. The first interconnect, and, hence, the protected transistor gate to which it is coupled, is said to be grounded. As long as the threshold voltage of the protection transistor is lower than the voltage at which the gate oxide of the protected transistor breaks down, charge damage to the protected transistor gate is prevented.

For one embodiment of the present invention, the protection transistor is an n-channel transistor. For this embodiment, after the RIE processing step described above, a third interconnect in a second interconnect layer above the first interconnect layer is used to couple the second interconnect to ground. As a result, the gate of the protection transistor is coupled to ground. This permanently turns off the protection transistor to allow for proper operation of the protected transistor in the final semiconductor device. For an alternate embodiment in which the protection transistor is a p-channel transistor, the third interconnect is coupled to a power supply (Vcc or Vdd) to permanently turn off the protection transistor. Alternatively, the second interconnect is directly coupled to ground via a Vss tap, or to a power supply via a Vcc tap, to permanently turn off the protection transistor.

Note that in accordance with an embodiment of the present invention, diode protection is also provided to the protected transistor gate by way of the source/drain region of the protection transistor. A more detailed description of embodiments of the present invention, including various configurations and implementations, is provided below.

FIG. 1 is a circuit schematic in accordance with one embodiment of the present invention in which protection circuit 101 operates to prevent charge damage to protected structures 100 during processing of the semiconductor device. Protected structures 100 are coupled to interconnect 110 at one end, and to substrate ground at the other end. Coupling a structure to substrate ground means that the structure is coupled to a tap of the semiconductor substrate, upon which the semiconductor device is built. During processing or final operation of the semiconductor device, the substrate is coupled to ground.

Interconnect 110 of FIG. 1 is coupled to interconnects 111, 112, and 113 as well as to a source/drain region of protection transistor 102. Note that, as used herein, a source/drain region is either a source or a drain of a transistor depending on factors such as whether the transistor is an n-channel or a p-channel transistor and how the designer has defined the nodes of the particular transistor. In most semiconductor manufacturing processes, defined sources and drains of a transistor are interchangeable such that, if properly biased, a defined "drain" can operate as a source, and vice-versa. To avoid confusion, the term source/drain region is used herein to indicate either a source or a drain depending on these factors. For the embodiment of the present invention shown in FIG. 1, protection transistor 102 is an n-channel transistor, interconnects 110–113 are coupled to its drain, and the source is n-type and is coupled to substrate ground.

The other source/drain region of protection transistor 102 of FIG. 1 is coupled to substrate ground. The gate of protection transistor 102 is coupled to interconnect 114 which is coupled to interconnects 115, 116, and 117. Interconnect 117 is coupled to interconnect 121 via interconnect 122. Interconnect 121 is coupled to interconnects 120, 119, and 118 which is coupled to substrate ground.

Interconnects 110, 114, and 118 of FIG. 1 are formed in the same, first interconnect layer, metal layer M1, of the semiconductor device. Interconnects 111, 115, and 119 are formed in the same, second interconnect layer, metal layer M2, above the first layer of the semiconductor device. Interconnects 112, 116, and 120 are formed in the same, third interconnect layer, metal layer M3, above the second layer of the semiconductor device. Interconnects 113, 117, and 121 are formed in the same, fourth interconnect layer, metal layer M4, above the third layer of the semiconductor device. Interconnect 122 is formed in the fifth interconnect layer, metal layer M5, above the fourth layer of the semiconductor device. Note that interconnects in the same interconnect layer of FIG. 1 are electrically isolated from each other.

For one embodiment of the present invention, protected structures 100 of FIG. 1 may include transistors, capacitors, resistors, diodes, interconnects, or other components of a semiconductor device that are susceptible to charge damage. Interconnects 110–122 may be formed using electrically conductive materials such as aluminum, copper, other metals or other conducting material. These interconnects are all etched using an RIE process that can charge up the interconnects and, consequently, the structures to which they are coupled.

An interconnect at a particular interconnect layer will tend to be charged similar to a nearby interconnect at the same layer, even if the two interconnects are electrically isolated from each other. Therefore, when interconnect 110, in the M1 layer of FIG. 1, charges up, interconnect 114, in the M1 layer, charges up as well. The charge on interconnect 114 turns on protection transistor 102, to which it is coupled, and the charge on interconnect 110 is then drained to ground, thereby preventing charge damage to protected structures 100. Note that when protection transistor 102 is turned on, interconnect 110 is grounded.

Similarly, when interconnect 111, in the M2 layer of FIG. 1, charges up, interconnect 115, in the M2 layer, charges up as well. The charge on interconnect 115 turns on protection transistor 102, to which it is coupled, grounding interconnect 111 and preventing charge damage to protected structures 100. When interconnect 112, in the M3 layer, charges up, interconnect 116, in the M3 layer, charges up as well. The charge on interconnect 116 turns on protection transistor 102, to which it is coupled, grounding interconnect 112 and preventing charge damage to protected structures 100. When interconnect 113, in the M4 layer, charges up, interconnect 117, in the M4 layer, charges up as well. The charge on interconnect 117 turns on protection transistor 102, to which it is coupled, grounding interconnect 113 and preventing charge damage to protected structures 100.

Finally, interconnect 122, in the M5 layer of FIG. 1, is used to couple interconnect 117 of the last protected interconnect layer, M4, to ground. This final step permanently turns off protection transistor 102 whenever the semiconductor device is operating. This allows protected structures 100 to function properly during normal operation of the device. Otherwise, interconnect 110 could become grounded through protection transistor 102 (if the gate floats above the threshold voltage), causing the loss of signals on interconnect 110.

In accordance with an embodiment of the present invention, protection transistor 102 of FIG. 1 is designed to be more resistant to charge damage than protected structures 100. For one embodiment, this is accomplished by coupling the gate of transistor 102 to a protection diode. In addition, for one embodiment, protection transistor 102 is designed to have a threshold voltage that is lower than the voltage at which protected structures 100 are damaged by charging. Protection transistor 102 is further designed to be wide enough to adequately drain the charge from interconnects 110–113, coupled to its source/drain region, without breaking down. Also, interconnects 114–117 are designed to act as antennas, picking up charge during the RIE process to avoid a situation in which interconnects 110–113, coupled to protected structures 100, charge up during RIE while interconnects 114–117 do not. For one embodiment of the present invention, these design goals are attained by appropriate sizing, placement, and orientation of protection transistor 102 and interconnects 114–117.

Figure 2A:
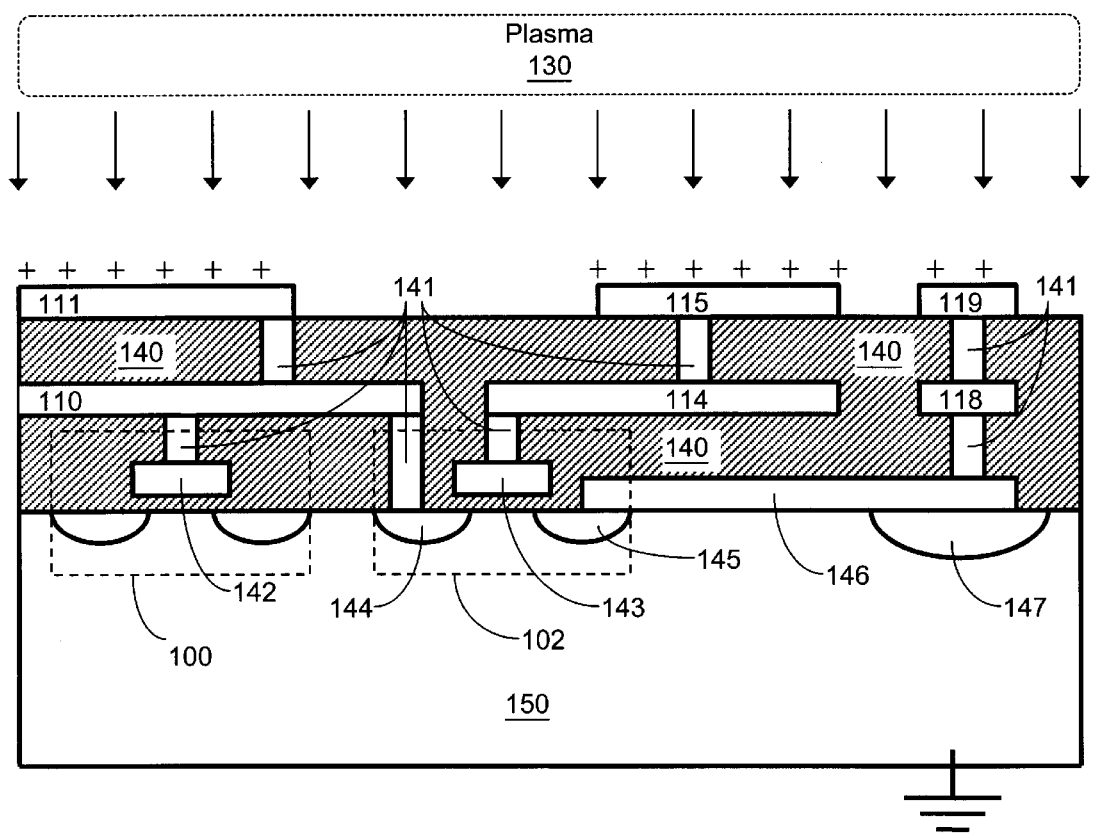

FIG. 2a is the protection circuit of FIG. 1 during processing of a semiconductor device within which the circuit is formed. Ions are directed toward the surface of the semiconductor device to etch interconnects 111, 115, and 119 of the metal-two interconnect layer, M2. Interconnects 110, 111, 114, 115, 118, 119, and 146 are surrounded by dielectric material 140. Protected transistor gate 142 is a protected structure of protected structures 100. Protection transistor 102 includes gate 143 and source/drain regions 144 and 145 formed in semiconductor substrate 150. Because protection transistor 102 is an n-channel transistor, both source/drain regions 144 and 145 are doped n-type in p-type substrate 150. Substrate tap 147 is a heavily doped p-type region in substrate 150.

Interconnect 110 of FIG. 2a is coupled to protected transistor gate 142 and interconnect 111 by vias 141. All vertical couplings of FIG. 2a are either contacts or vias, 141, formed by etching a hole through dielectric material 140 to a desired, underlying structure, and filling the hole with conductive material such as tungsten, aluminum, copper, or other metal. Note that, as used herein, the terms contact and via are used interchangeably to indicate a vertical electrical coupling between two conductive layers. Interconnect 110 is coupled to source/drain region 144 of protection transistor 102 by contact 141. Interconnect 114 is coupled, by way of vias 141, to gate 143 and to interconnect 115. Interconnect 146 couples source/drain region 145 to substrate tap 147 and comprises a conductive material such as heavily doped polysilicon. Interconnect 118 is coupled, by way of vias 141, to interconnect 119 and interconnect 146.

FIG. 2a depicts the operation of the protection circuit during RIE and charging up of the M2 interconnect layer. Plasma 130 is formed to etch interconnects 111, 115, and 119 from layer M2 of the device using RIE. Note that the semiconductor device of FIG. 2a is shown at the moment that plasma 130 etches through the M2 layer to isolate interconnects 111, 115, and 119. Before and during the RIE process step, these three interconnects are coupled together as part of the M2 layer. During the RIE process, substrate 150 is grounded.

As plasma 130 of FIG. 2a sends ions accelerating toward the surface of the semiconductor device, interconnects on the surface of the device, interconnects 111, 115, and 119, are charged up. Because interconnect 119 is grounded via interconnects 118, 146, and substrate tap 147, no substantial charge is built up on interconnect 119. Charge that is built up on interconnect 115 is directed through to gate 143 via interconnect 114. If the voltage of gate 143 exceeds the threshold voltage of protection transistor 102, then transistor 102 turns on. Once turned on, charge that is built up on interconnect 111 is drained to ground via interconnect 110, transistor 102, interconnect 146, and substrate tap 147. As a result, interconnect 111 is coupled to ground and no substantial charge builds up. Consequently, no substantial charge is directed through to protected gate 142, preventing charge damage to this transistor.

Another feature of a protection structure formed in accordance with an embodiment of the present invention is the diode action of the source/drain region of the protection transistor that is coupled to the protected structure. N-type source/drain region 144 of FIG. 2a forms a diode with p-type substrate 150. If the RIE process charges the interconnects on the surface of the semiconductor device positively, as shown in FIG. 2a, then the diode formed by source/drain region 144 is reverse biased. If the reverse bias breakdown voltage of the diode formed by source/drain region 144 is less than the breakdown voltage of the gate oxide beneath gate 142 of protected structures 100, then the diode breaks down before protected structures 100 are damaged. Alternatively, the reverse bias leakage of the diode formed by source/drain region 144 may be sufficient to protect protected structures 100 before the diode breaks down.

Hence, the diode formed by source/drain region 144 of FIG. 2a provides additional protection to protected structures 100, preventing charge damage to the protected gate oxide by grounding interconnect 111 and gate 142 before they become too heavily charged. For one embodiment of the present invention, this feature may be found useful for cases in which transistor 102 fails to turn on properly due to, for example, gate oxide breakdown. Alternatively, if the RIE process, or any other process, results in interconnect 111 becoming negatively charged, the diode formed by source/drain region 144 is then forward biased, grounding interconnect 111 and preventing charge damage to protected structures 100.

Figure 2B:
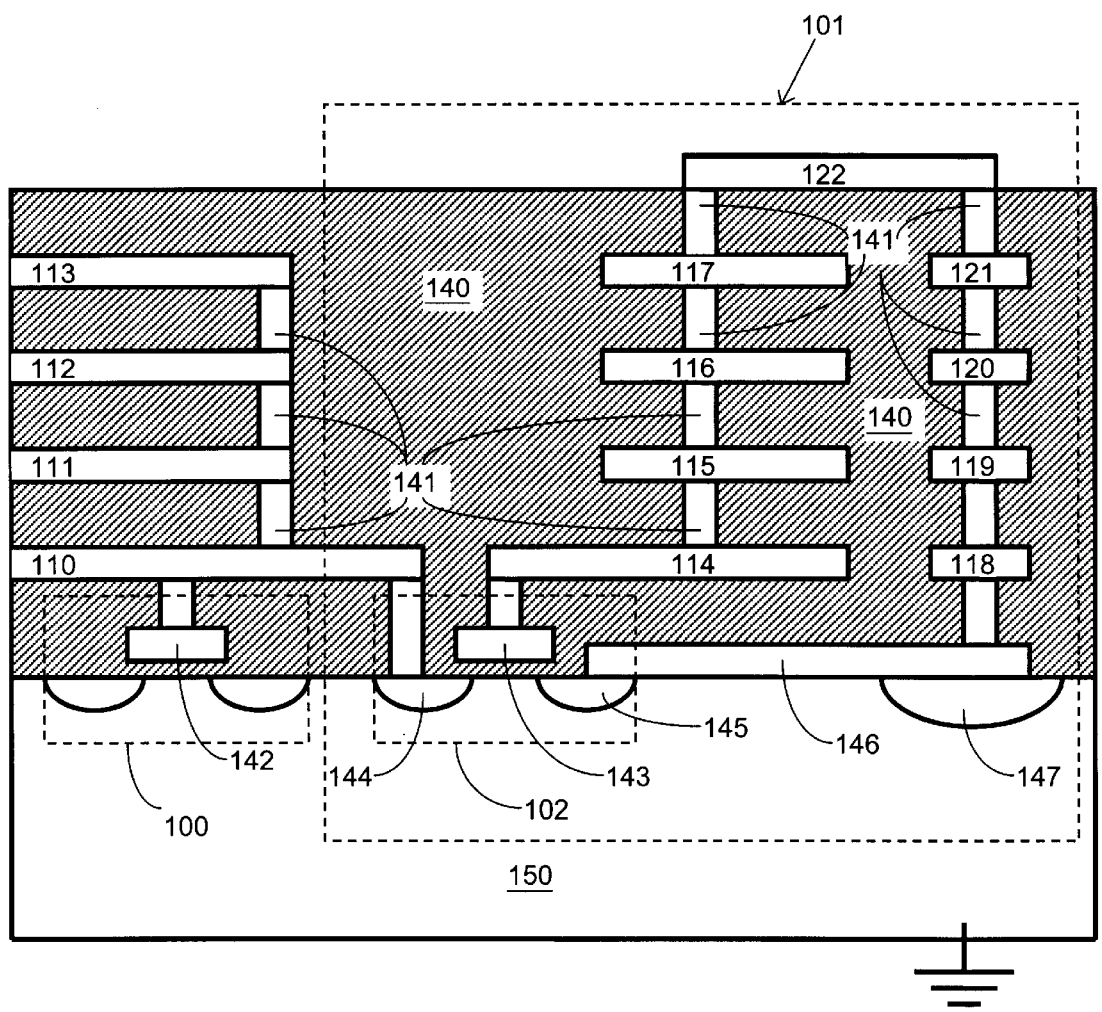

FIG. 2b is the protection circuit of FIG. 1 during operation of the semiconductor device within which protection circuit 101 is formed. Interconnects 110–122 and 146 are surrounded by dielectric material 140. Interconnect 116 is coupled, by way of vias 141, to interconnect 115 and interconnect 117. Interconnect 120 is coupled, by way of vias 141, to interconnect 119 and interconnect 121. Interconnect 122 is coupled, by way of vias 141, to interconnects 117 and 121.

During normal operation of the semiconductor device of FIG. 2b, substrate 150 is grounded. Interconnect 122 ensures that transistor 102 does not interfere with the intended operation of protected structures 100. Interconnect 122 has the effect of grounding the gate of transistor 102, permanently turning off the transistor.

For alternate embodiments of the present invention, the basic structure of protection circuit 101 of FIG. 2b can be expanded to provide protection to structures coupled to interconnects in interconnect layers higher than the interconnect layer of interconnect 113. Alternatively, the basic structure of protection circuit 101 can also be limited to only provide protection to structures coupled to interconnects in the interconnect layers of interconnect 110, interconnects 110 and 111, or interconnects 110, 111, and 112.

For another embodiment of the present invention, protection circuit 101 of FIG. 2b is used to prevent charge damage to protected structures 100 during processing steps other than RIE. For example, other processing steps such as photoresist ash, sputter deposition, chemical vapor deposition, and wet chemical bathes can cause charge damage under certain conditions. In addition, unintended electrostatic discharge during processing can cause charge damage. A protection circuit formed in accordance with an embodiment of the present invention can prevent this damage.

In accordance with an alternate embodiment of the present invention, a p-channel transistor is used as the protection transistor of the protection circuit. This embodiment may be found useful for protecting the semiconductor device from damage due to negative (e.g. electron) charging of interconnects. For this embodiment, the gate is coupled to a Vcc tap to permanently turn off the transistor. A Vcc (or Vdd, or power) tap is an interconnect in a semiconductor device that is designed to be coupled to the power supply of the device upon operation of the device. For this embodiment, an n-type semiconductor substrate may be used to ground the substrate during processing.

Figure 3:
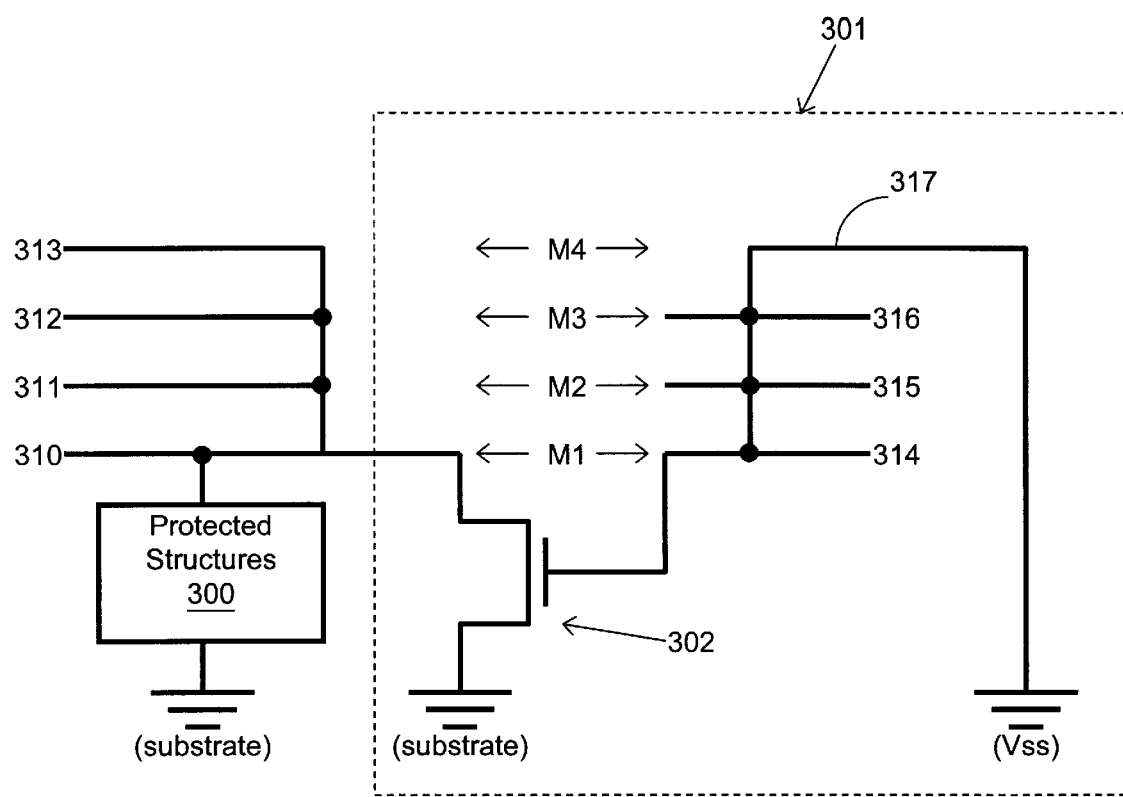

FIG. 3 is a protection circuit schematic in accordance with an alternate embodiment of the present invention in which protection circuit 301 operates to prevent charge damage to protected structures 300 during processing of the semiconductor device. Protected structures 300 are coupled to interconnects 310–313 at one end, and substrate ground at the other end. In addition, protected structures 300 are coupled to a source/drain region of n-channel protection transistor 302. The other source/drain region of protection transistor 302 is coupled to substrate ground. The gate of protection transistor 302 is coupled to interconnects 314–317. Interconnect 317 is coupled to ground via a Vss tap. A Vss tap (or a ground tap) is an interconnect in a semiconductor device that is designed to be coupled to the ground supply of the device upon operation of the device.

Interconnects 310 and 314 of FIG. 1 are formed in the same, first interconnect layer, metal layer M1, of the semiconductor device. Interconnects 311 and 315 are formed in the same, second interconnect layer, metal layer M2, above the first layer of the semiconductor device. Interconnects 312 and 316 are formed in the same, third interconnect layer, metal layer M3, above the second layer of the semiconductor device. Interconnects 313 and 317 are formed in the same, fourth interconnect layer, metal layer M4, above the third layer of the semiconductor device. Note that all interconnects in the same interconnect layer are electrically isolated from each other.

Protection circuit 301 operates in a manner similar to protection circuit 101 described above. In accordance with the embodiment of FIG. 3, however, the gate of transistor 302 is permanently turned off by coupling the gate to a Vss tap rather than to a substrate tap. This embodiment may be found useful for eliminating the need for an additional interconnect formed in an interconnect layer above the highest interconnect layer to which protected structures 300 are coupled. The Vss tap floats during the RIE process used to etch interconnects 313 and 317 of interconnect layer M4. Therefore, protection transistor 302 is allowed to operate properly to prevent charge damage to protected structures 300 during the RIE process. Subsequently, when the final semiconductor device is operated under normal conditions, the Vss tap is grounded to turn off transistor 302, thereby preventing interference with the operation of protected structures 300.

This invention has been described with reference to specific exemplary embodiments thereof. It will, however, be evident to persons having the benefit of this disclosure that various modifications and changes may be made to these embodiments without departing from the broader spirit and scope of the invention. The specification and drawings are, accordingly, to be regarded in an illustrative rather than a restrictive sense.

What is claimed is:

1. A method of preventing charge damage to a protected structure during processing of a semiconductor device, the method comprising the steps of:
   a. coupling a first source/drain region of a protection transistor to the protected structure;
   b. coupling a second source/drain region of the protection transistor to ground; and
   c. turning on the protection transistor to ground the protected structure during the processing.

2. The method of claim 1, further comprising the step of coupling a gate of the protection transistor to a semiconductor substrate of the semiconductor device after the step of turning on the protection transistor.

3. The method of claim 1, further comprising the step of coupling a gate of the protection transistor to a Vss tap after the step of turning on the protection transistor.

4. The method of claim 1, further comprising the step of permanently turning off the protection transistor after the step of turning on the protection transistor.

5. The method of claim 1, further comprising the step of coupling a gate of the the protection structure to a diode that is reversed biased during the processing.

6. The method of claim 1, wherein the step of coupling the first source/drain region of the protection transistor to the protected structure includes the step of coupling the first source/drain region to an interconnect that is coupled to the protected structure, the interconnect being charged up during the processing.

7. The method of claim 6, wherein the step of turning on the protection transistor includes the step of coupling a gate of the protection transistor to a first interconnect disposed in a same interconnect layer of the semiconductor device as a second interconnect, the second interconnect being coupled to the protected structure, the first and second interconnects being charged up during the processing.

8. The method of claim 1, wherein the step of turning on the protection transistor includes the step of coupling a gate of the protection transistor to a first interconnect disposed in a same interconnect layer of the semiconductor device as a second interconnect, the second interconnect being coupled to the protected structure, the first and second interconnects being charged up during the processing.

9. The method of claim 1, wherein the step of turning on the protection transistor is done during reactive ion etching of the semiconductor device.

10. The method of claim 1, wherein the step of coupling a first source/drain region of a protection transistor to the protected structure includes coupling the first source/drain region to a protected transistor gate, and the step of turning on the protection transistor includes grounding the protected transistor gate.

* * * * *